United States Patent
Chen et al.

(10) Patent No.: US 9,876,138 B2
(45) Date of Patent: *Jan. 23, 2018

(54) LIGHT-EMITTING DEVICES

(71) Applicant: EPISTAR CORPORATION, Hsinchu (TW)

(72) Inventors: Chao-Hsing Chen, Hsinchu (TW); Yu-Chen Yang, Hsinchu (TW); Li-Ping Jou, Hsinchu (TW); Hui-Chun Yeh, Hsinchu (TW); Yi-Wen Ku, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/273,439

(22) Filed: Sep. 22, 2016

(65) Prior Publication Data

US 2017/0012167 A1    Jan. 12, 2017

Related U.S. Application Data

(63) Continuation of application No. 14/705,453, filed on May 6, 2015, now Pat. No. 9,472,725, which is a
(Continued)

(51) Int. Cl.
*H01L 33/08* (2010.01)
*H01L 33/62* (2010.01)
(Continued)

(52) U.S. Cl.
CPC ............. *H01L 33/08* (2013.01); *H01L 33/20* (2013.01); *H01L 33/30* (2013.01); *H01L 33/38* (2013.01);
(Continued)

(58) Field of Classification Search
None
See application file for complete search history.

(56) References Cited

U.S. PATENT DOCUMENTS 5,684,309 A    11/1997  Mcintosh et al.
5,831,277 A    11/1998  Razeghi
(Continued)

FOREIGN PATENT DOCUMENTS

CN    101796656 A    8/2010
TW    201007925 A1   2/2010

*Primary Examiner* — Asok K Sarkar
(74) *Attorney, Agent, or Firm* — Muncy, Geissler, Olds & Lowe, P.C.

(57) ABSTRACT

A light-emitting device comprises a semiconductor layer sequence comprising a first semiconductor layer having a first electrical conductivity, a second semiconductor layer having a second electrical conductivity, and an active layer interposed between the first semiconductor layer and the second semiconductor layer; a plurality of beveled trenches formed in the semiconductor layer sequence; a plurality of protruding structures respectively formed in the plurality of beveled trenches; a dielectric layer formed on the second semiconductor layer and an inner sidewall of the plurality of beveled trenches; a reflecting layer interposed between the semiconductor layer sequence and the dielectric layer; and a metal layer formed along the inner sidewall of the plurality of beveled trenches, wherein the dielectric layer, the reflecting layer and the metal layer are overlapping, the plurality of protruding structures and the reflecting layer are not overlapping.

20 Claims, 4 Drawing Sheets

Related U.S. Application Data continuation of application No. 14/093,924, filed on Dec. 2, 2013, now Pat. No. 9,048,379, which is a continuation of application No. 13/221,369, filed on Aug. 30, 2011, now Pat. No. 8,598,614.

(60) Provisional application No. 61/378,197, filed on Aug. 30, 2010.

(51) Int. Cl.
- *H01L 33/20* (2010.01)
- *H01L 33/38* (2010.01)
- *H01L 33/60* (2010.01)
- *H01L 33/30* (2010.01)
- *H01L 33/46* (2010.01)
- *H01L 33/44* (2010.01)
- *H01L 33/00* (2010.01)

(52) U.S. Cl.
CPC ............ *H01L 33/382* (2013.01); *H01L 33/46* (2013.01); *H01L 33/60* (2013.01); *H01L 33/62* (2013.01); *H01L 33/0012* (2013.01); *H01L 33/44* (2013.01)

(56) References Cited

U.S. PATENT DOCUMENTS

| | | |
|---|---|---|
| 6,172,382 B1 | 1/2001 | Nagahama et al. |
| 8,598,614 B2 | 12/2013 | Chen et al. |
| 9,048,379 B2 | 6/2015 | Chen et al. |
| 9,472,725 B2 * | 10/2016 | Chen .................... H01L 33/20 |
| 2002/0070125 A1 | 6/2002 | Ng et al. |
| 2006/0180820 A1 | 8/2006 | Illek et al. |
| 2010/0171135 A1 | 7/2010 | Engl et al. |
| 2010/0207157 A1 | 8/2010 | Schiaffino et al. |
| 2011/0101390 A1 | 5/2011 | Engl et al. |

* cited by examiner

LIGHT-EMITTING DEVICES

REFERENCE TO RELATED APPLICATION

This application is a continuation application of U.S. patent application Ser. No. 14/705,453, filed on May 6, 2015, which is a continuation application of U.S. patent application Ser. No. 14/093,924, filed on Dec. 2, 2013, now U.S. Pat. No. 9,048,379, issued Jun. 2, 2015, which is a continuation application of U.S. patent application Ser. No. 13/221,369, filed on Aug. 30, 2011, now U.S. Pat. No. 8,598,614, issued Dec. 3, 2013, which claims the right of priority based on and U.S. provisional application Ser. No. 61/378,197, filed on Aug. 30, 2010, and the contents of which are hereby incorporated by references in their entireties.

TECHNICAL FIELD

The application relates to a light-emitting device, and more particularly, to a light-emitting device with a connection structure.

DESCRIPTION OF BACKGROUND ART

The light-emitting diode (LED) is a solid state semiconductor device, which has been broadly used as a light-emitting device. The light-emitting device structure at least comprises a p-type semiconductor layer, an n-type semiconductor layer, and an active layer. The active layer is formed between the p-type semiconductor layer and the n-type semiconductor layer. The structure of the light-emitting device generally comprises III-V group compound semiconductor such as gallium phosphide, gallium arsenide, or gallium nitride. The light-emitting principle of the LED is the transformation of electrical energy to optical energy by applying electrical current to the p-n junction to generate electrons and holes. Then, the LED emits light when the electrons and the holes combine.

Figure 1:
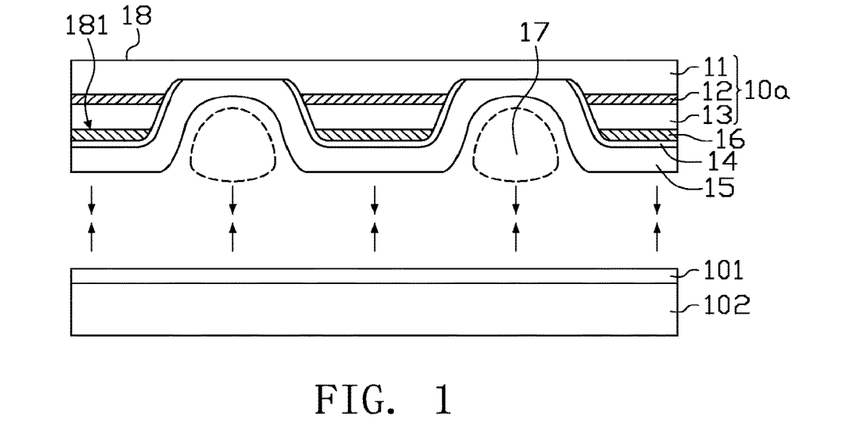
FIG. 1 illustrates a cross-sectional diagram of a conventional light-emitting device before bonding process.

FIG. 1 illustrates a cross-sectional diagram of a conventional light-emitting device before bonding process. The light-emitting device comprises a semiconductor layer sequence 10a provided with a first main side 18 and a second main side 181, comprising a first semiconductor layer 11, a second semiconductor layer 13, and an active layer 12 formed between the first semiconductor layer 11 and the second semiconductor layer 13, which can produce electromagnetic radiation. A trench is formed in the semiconductor layer sequence 10a by wet etch or dry etch. A dielectric layer 14 is formed on the inner sidewall of the trench to electrically insulate the second semiconductor layer 13 and the active layer 12. Then, an electrically conductive material is filled into the insulated trench, so a first metal layer 15 is formed. A reflecting layer 16 is formed between the semiconductor layer sequence 10a and the dielectric layer 14. A void 17 is an area not occupied by the first metal layer 15. A first connection layer 101 formed on a carrier substrate 102 is used to connect the first metal layer 15. The first connection layer 101 and the first metal layer 15 are connected together in an electrically conductive manner. As shown in FIG. 1, after forming the first connection layer 101 and the first metal layer 15, the semiconductor layer sequence 10a is connected to the carrier substrate 102 by metal bonding or glue bonding.

Figure 2A:
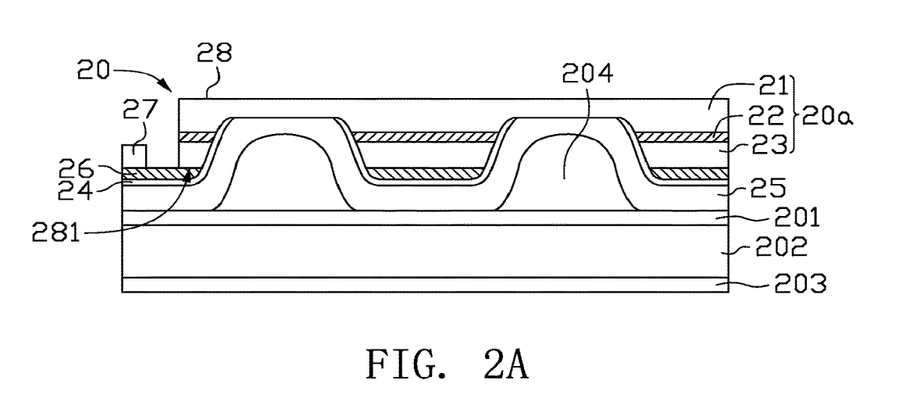
FIG. 2A illustrates a cross-sectional diagram of a conventional light-emitting device.
Figure 2B:
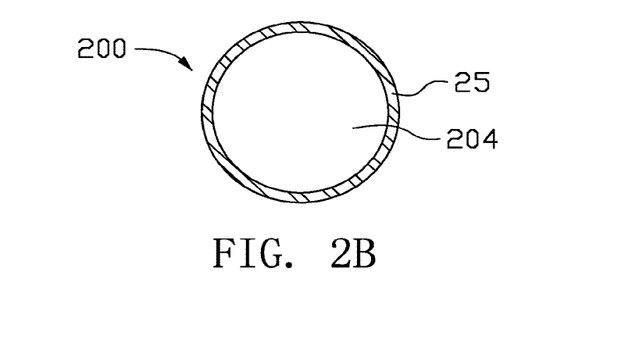
FIG. 2B illustrates a top-view diagram of a trench shown in FIG. 2A.

FIG. 2A illustrates a cross-sectional diagram of a conventional light-emitting device 20. As shown in FIG. 2A, connecting failure problem arises in the bonding process. FIG. 2A shows the result of the bonding process after a first metal layer 25 is connected to a first connection layer 201. However, because the trench is deep, it is not easy to fill the trench with electrically conductive material, and the profile of the trench trench is concave after the filling process. While the first metal layer 25 is connected to the first connection layer 201 of a carrier substrate 202, a void 204 is formed between the first metal layer 25 and the first connection layer 201. Thus, the connection area between the first metal layer 25 and the first connection layer 201 is small and the resistance of the light-emitting device 20 is therefore raised. As shown in FIG. 2B, the peripheral area of the trench 200 is occupied by the first metal layer 25, and the internal internal area not occupied by the first metal layer 25 forms the void 204.

SUMMARY OF THE APPLICATION

An object of the present application is to reduce the size of the void formed in the filling process of the trench and increase the connection area between the first metal layer and the first connection layer of the carrier substrate for electrical characteristics and light emission efficiency improvement.

A light-emitting device of an embodiment of the present application comprises a semiconductor layer sequence provided with a first main side, a second main side, and an active layer; a beveled trench formed in the semiconductor layer sequence, having a top end close to the second main side, a bottom end, and an inner sidewall connecting the top end and the bottom end. In the embodiment, the inner sidewall is an inclined surface. The light-emitting device further comprises a dielectric layer disposed on the inner sidewall of the beveled trench and the second main side; a first metal layer formed on the dielectric layer; a carrier substrate; and a first connection layer connecting the carrier substrate and the semiconductor layer sequence.

A light-emitting device comprises a semiconductor layer sequence comprising a first semiconductor layer having a first electrical conductivity, a second semiconductor layer having a second electrical conductivity, and an active layer interposed between the first semiconductor layer and the second semiconductor layer; a plurality of protruding structures; a plurality of beveled trenches in the semiconductor layer sequence and respectively accommodating the plurality of protruding structures; a dielectric layer on the second semiconductor layer and an inner sidewall of the plurality of beveled trenches, wherein the dielectric layer comprises a surface perpendicular to a thickness direction of the semiconductor layer sequence; a metal layer formed along the inner sidewall of the plurality of beveled trenches and extending to the surface of the dielectric layer, wherein the metal layer is insulated from the second semiconductor layer by the dielectric layer; and a first electrode formed on the plurality of protruding structures.

A light-emitting device comprises a semiconductor layer sequence comprising a first semiconductor layer having a first electrical conductivity, a second semiconductor layer having a second electrical conductivity, and an active layer interposed between the first semiconductor layer and the second semiconductor layer; a plurality of beveled beveled trenches formed in the semiconductor layer sequence; a plurality of protruding structures respectively formed in the plurality of beveled trenches; a dielectric layer formed on the second semiconductor layer and an inner sidewall of the plurality of beveled trenches; a reflecting layer interposed between the semiconductor layer sequence and the dielectric layer; and a metal layer formed along the inner sidewall of the plurality of beveled trenches, wherein the dielectric layer, the reflecting layer and the metal layer are overlapping, the plurality of protruding structures and the reflecting layer are not overlapping.

A light-emitting device comprises a semiconductor layer sequence comprising a first semiconductor layer having a first electrical conductivity, a second semiconductor layer having a second electrical conductivity, and an active layer interposed between the first semiconductor layer and the second semiconductor layer; a beveled trench formed in the semiconductor layer sequence; a protruding structure formed in the beveled trench; a dielectric layer formed on the second semiconductor layer and an inner sidewall of the beveled trench; a reflecting layer interposed between the semiconductor layer sequence and the dielectric layer; a metal layer formed along the inner sidewall of the beveled trench; a carrier substrate; and a void between the metal layer and the carrier substrate.

DETAILED DESCRIPTION OF PREFERRED EMBODIMENTS

The embodiment of the application is illustrated in detail, and is plotted in the drawings. The same or the similar part is illustrated in the drawings and the specification with the same number.

Figure 3A:
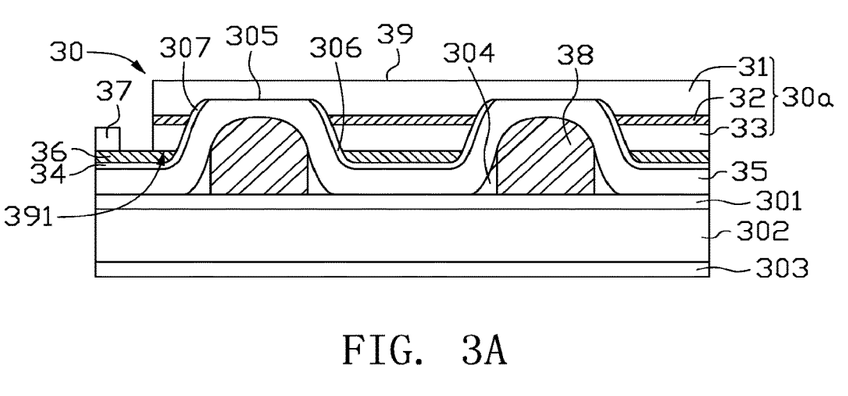
FIG. 3A illustrates a cross-sectional diagram according to the first embodiment of the present application.

FIG. 3A illustrates a cross-sectional diagram of a light-emitting device 30 according to the first embodiment of the present application. In the embodiment, the light-emitting device 30 comprises a semiconductor layer sequence 30a provided with a first main side 39, a second main side 391, and an active layer 32; a beveled trench formed in the semiconductor layer sequence 30a, having a top end 306 close to the second main side 391, a bottom end 305, and an inner sidewall 307 connecting the top end 306 and the bottom end 305. In the embodiment, the inner sidewall 307 is an inclined surface. The light-emitting device 30 further comprises a dielectric layer 34 disposed on the inner sidewall 307 of the beveled trench and the second main side 391; a first metal layer 35 formed on the dielectric layer 34; a carrier substrate 302; and a first connection layer 301 connecting the carrier substrate 302 and the semiconductor layer sequence 30a. The semiconductor layer sequence 30a further comprises a first semiconductor layer 31 having a first electrical conductivity formed near the first main side 39, and a second semiconductor layer 33 having a second electrical conductivity formed near the second main side 391, wherein the active layer 32 is interposed between the first semiconductor layer 31 and the second semiconductor layer 33. The material of the active layer 32 can comprise InGaN-based material, AlGaAs-based material, or AlInGaP-based material.

The beveled trench is formed in the semiconductor layer sequence 30a by wet etch or dry etch. The bottom end 305 of the beveled trench is formed in the first semiconductor layer 31 of the semiconductor layer sequence 30a, and the top end 306 of the beveled trench is formed close to the second main side 391. The area near the top end 306 of the beveled trench is larger than the area near the bottom end 305 of the beveled trench. The dielectric layer 34 is formed on the inner sidewall 307 of the beveled trench to electrically insulate the second semiconductor layer 33 and the active layer 32. The material of the dielectric layer 34 comprises silicon oxide, silicon nitride, magnesium oxide, tantalum oxide, titanium oxide, or polymer. In addition, in order to increase the luminous efficiency, a reflecting layer 36 is interposed between the semiconductor layer sequence 30a and the dielectric layer 34. The material of the reflecting layer 36 comprises metal or metal alloy.

Figure 3B:
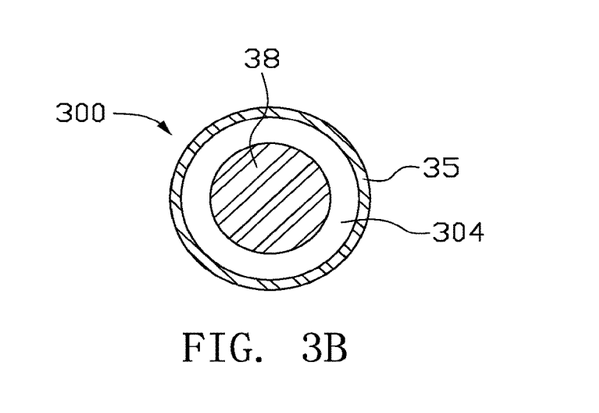
FIG. 3B illustrates a top-view diagram of a beveled trench shown in FIG. 3A.

Then, the beveled trench is filled by the first metal layer 35. The material of the first metal layer 35 comprises metal like Ni, Au, Ti, Cr, Au, Zn, Al, Pt, or the combination thereof. During the filling process of the first metal layer 35, a concave area is formed. Thus, a second filling process of the beveled trench is performed via an additional local electro-plating process, wherein the first metal layer 35 functions as the seed layer, and a conductive protruding structure 38 is formed selectively on the concave area of the beveled trench by the electro-plating process. The material of the conductive protruding structure 38 comprises conductive metal like Ni, Au, Ti, Cr, Au, Zn, Al, Pt, or the combination thereof. Therefore, the total connecting area between the first metal layer 35 and the first connection layer 301 is enlarged as shown in FIG. 3B compared with FIG. 2B, and the connection resistance can be reduced. As shown in FIG. 3B, the top view of the beveled trench 300 is circular or elliptic, and the top view of the conductive protruding structure 38 is circular or elliptic. The circumference of the conductive protruding structure 38 is smaller than the circumference of the beveled trench. The conductive protruding structure 38 is accommodated in the beveled trench. A void 304 disposed between the first metal layer 35 and the conductive protruding structure 38 is not filled by the first metal layer 35 or the material of the conductive protruding structure 38. As shown in FIG. 3B, the peripheral area of the beveled trench 300 is occupied by the first metal layer 35, the internal area of the beveled trench 300 is is occupied by the conductive protruding structure 38, and the void 304 is formed between the first metal layer 35 and the conductive protruding structure 38. With the conductive protruding structure 38, the total connection area between the first metal layer 35 and the first connection layer 301 is enlarged as shown in FIG. 3B compared with FIG. 2B, and the connection resistance is reduced.

After forming the first metal layer 35 and the conductive protruding structure 38, the semiconductor layer sequence 30a is connected to the carrier substrate 302 by the first connection layer 301. The material of the first connection layer 301 comprises metal like Au, Sn, Cr, Zn, Ni, Ti, Pt, or the combination thereof. The carrier substrate 302 is a conductive substrate comprising metal or metal alloy like Cu, Al, Sn, Zn, Cd, Ni, Co, W, Mo, or the combination thereof. The light-emitting device 30 according to the embodiment of the present application further comprises a first electrode 303 formed on the carrier substrate 302 and electrically connected to the first semiconductor layer 31, and a second electrode 37 electrically connected to the second semiconductor layer 33.

Figure 4A:
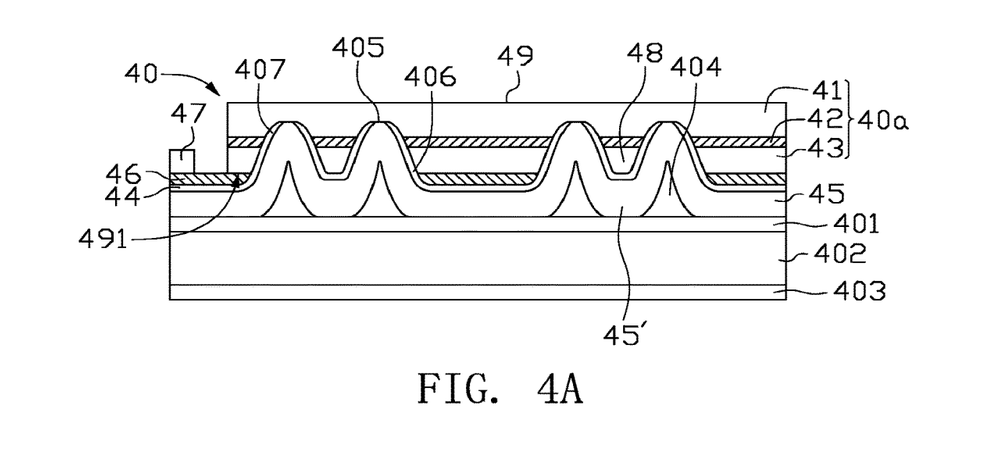
FIG. 4A illustrates a cross-sectional diagram according to the second embodiment of the present application.

FIG. 4A illustrates a cross-sectional diagram of a light-emitting device 40 according to the second embodiment of the present application. In the embodiment, the light-emitting device 40 comprises a semiconductor layer sequence 40a provided with a first main side 49, a second main side 491, and an active layer 42; a beveled trench formed in the semiconductor layer sequence 40a having a top end 406 close to the second main side 491, a bottom end 405, and an inner sidewall 407 connecting the top end 406 and the bottom end 405. In the embodiment, the inner sidewall 407 is an inclined surface. The light-emitting device 40 further comprises a dielectric layer 44 disposed on the inner sidewall 407 of the beveled trench and the second main side 491; a first metal layer 45 formed on the dielectric layer 44; a carrier substrate 402; and a first connection layer 401 connecting the carrier substrate 402 and the semiconductor layer sequence 40a. The semiconductor layer sequence 40a further comprises a first semiconductor layer 41 having a first electrical conductivity formed near the first main side 49, and a second semiconductor layer 43 having a second electrical conductivity formed near the second main side 491, wherein the active layer 42 is interposed between the first semiconductor layer 41 and the second semiconductor layer 43. The material of the active layer 42 can comprise InGaN-based material, AlGaAs-based material, or AlInGaP-based material.

Figure 4B:
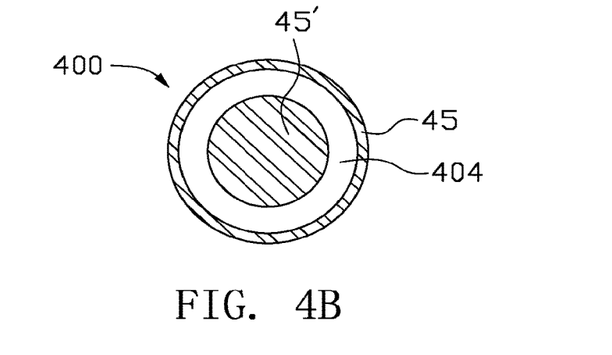
FIG. 4B illustrates a top-view diagram of a beveled trench shown in FIG. 4A.

The beveled trench is formed in the semiconductor layer sequence 40a by wet etch or dry etch. The bottom end 405 of the beveled trench is formed in the first semiconductor layer 41 of the semiconductor layer sequence 40a, and the top end 406 of the beveled trench is formed close to the second main side 491. The area near the top end 406 of the beveled trench is larger than the area near the bottom end 405 of the beveled trench. Partial of the semiconductor layer sequence 40a in the beveled trench is remained by the conventional lithography and etch method, that is, there is a conductive protruding structure 48 formed in the beveled trench. The conductive protruding structure 48 comprises a layer sequence substantially comprising the same material as the semiconductor layer sequence 40a. The material of the layer sequence of the conductive protruding structure 48 comprises one or more than one element selecting from a group consisting of gallium (Ga), aluminum (Al), indium (In), phosphor (P), nitrogen (N), zinc (Zn), cadmium (Cd), arsenide (As), silicon (Si), and selenium (Se). Because not all of the semiconductor layers in the beveled trench are etched away, the space needed to be filled is not deep as the structure shown in FIG. 2A, and it is easier for the first metal layer 45 to fill the space in the beveled trench. The material of the first metal layer 45 comprises Ni, Au, Ti, Cr, Au, Zn, Al, Pt, or the combination thereof. Similarly, the total connecting area between the first metal layer 45 and the first connection layer 401 is enlarged as shown in FIG. 4B compared with FIG. 2B and the connection resistance can be reduced. As shown in FIG. 4B, the top view of the beveled trench 400 is circular or elliptic, and the top view of the conductive protruding structure 48 is circular or elliptic. The circumference of the conductive protruding structure 48 is smaller than the circumference of the beveled trench 400. A void 404 disposed in the first metal layer 45 is not filled by the first metal layer 45 or the material of the conductive protruding structure 48. As shown in FIG. 4B, the peripheral area of the beveled trench 400 is occupied by the first metal layer 45, the internal area 45' of the beveled trench 400 is occupied by the same material of the first metal layer 45, and the void 404 is formed in the first metal layer 45. With the conductive protruding structure 48, the total connection area between the first metal layer 45 and the first connection layer 401 is enlarged as shown in FIG. 4B compared with FIG. 2B, and the connection resistance is reduced.

The dielectric layer 44 is formed on the inner sidewall 407 of the beveled trench and the surface of the conductive protruding structure 48 to electrically insulate the second semiconductor layer 43 and the active layer 42. The material of the dielectric layer 44 comprises silicon oxide, silicon nitride, magnesium oxide, tantalum oxide, titanium oxide, or polymer. In addition, in order to increase the luminous efficiency, a reflecting layer 46 is interposed between the semiconductor layer sequence 40a and the dielectric layer 44. The material of the reflecting layer 46 comprises metal or metal alloy.

After forming the first metal layer 45 and the conductive protruding structure 48, the semiconductor layer sequence 40a is connected to the carrier substrate 402 by the first connection layer 401. The material of the first connection layer 401 comprises metal like Au, Sn, Cr, Zn, Ni, Ti, Pt, or the combination thereof. The carrier substrate 402 is a conductive substrate comprising metal or metal alloy like Cu, Al, Sn, Zn, Cd, Ni, Co, W, Mo, or the combination thereof. The light-emitting device 40 according to the embodiment of the present application further comprises a first electrode 403 formed on the carrier substrate 402 and electrically connected to the first semiconductor layer 41, and a second electrode 47 electrically connected to the second semiconductor layer 43.

Figure 5A:
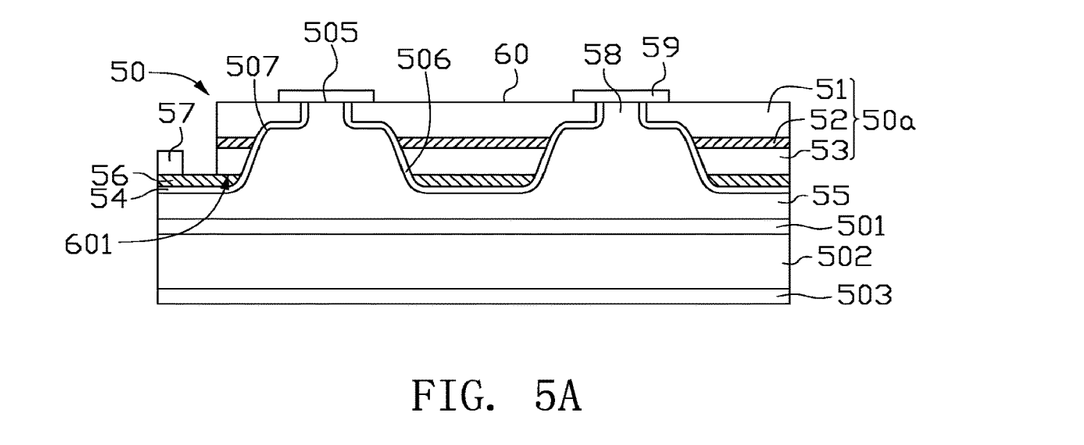
FIG. 5A illustrates a cross-sectional diagram according to the third embodiment of the present application.

FIG. 5A illustrates a cross-sectional diagram of a light-emitting device 50 according to the third embodiment of the present application. In the embodiment, the light-emitting device 50 comprises a semiconductor layer sequence 50a provided with a first main side 60, a second main side 601, and an active layer 52; a beveled trench formed through the semiconductor layer sequence 50a, having a top end 506 close to the second main side 601, a bottom end 505, and an inner sidewall 507 connecting the top end 506 and the bottom end 505. In the embodiment, the inner sidewall 507 is an inclined surface. The light-emitting device 50 further comprises a dielectric layer 54 disposed on the inner sidewall 507 of the beveled trench and the second main side 601; a first metal layer 55 formed on the dielectric layer 54; a carrier substrate 502; and a first connection layer 501 connecting the carrier substrate 502 and the semiconductor layer sequence 50a. The semiconductor layer sequence 50a further comprises a first semiconductor layer 51 having a first electrical conductivity formed near the first main side 60 of the semiconductor layer sequence 50a, and a second semiconductor layer 53 having a second electrical conductivity formed near the second main side 601 of the semiconductor layer sequence 50a, wherein the active layer 52 is interposed between the first semiconductor layer 51 and the second semiconductor layer 53. The material of the active layer 52 can comprise InGaN-based material, AlGaAs-based material, or AlInGaP-based material.

During the filling process of the beveled trench, the beveled trench cannot be fully filled with the conductive material because there is some gas remained in the beveled trench. After the conductive material is filled into the beveled trench, the conductive material is solidified by cooling. In the cooling process, the gas goes out and the concave area forms. Therefore, in the embodiment of the present application, the beveled trench is formed through the semiconductor layer sequence 50a by wet etch or dry etch. The area near the top end 506 of the beveled trench is larger than the area near the bottom end 505 of the beveled trench. The bottom end 505 of the beveled trench is formed on the first main side 60, and the top end 506 of the beveled trench is formed near the second main side 601.

The dielectric layer 54 is formed on the inner sidewall 507 of the beveled trench to electrically insulate the second semiconductor layer 53 and the active layer 52. The material of the dielectric layer 54 comprises silicon oxide, silicon nitride, magnesium oxide, tantalum oxide, titanium oxide, or polymer. In addition, in order to increase the luminous efficiency, a reflecting layer 56 is interposed between the semiconductor layer sequence 50a and the dielectric layer 54. The material of the reflecting layer 56 comprises metal or metal alloy.

Figure 5B:
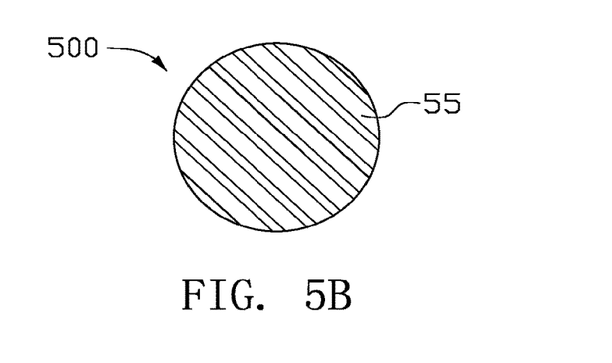
FIG. 5B illustrates a top-view diagram of a beveled trench shown in FIG. 5A.

In the light-emitting device 50 of the present application, there is no remaining gas left in the beveled trench, and the first metal layer 55 can overflow the whole beveled trench to make a back connection 59. The back connection 59 comprising the same material as the first metal layer 55 is formed on the first main side 60 and electrically connected to the first semiconductor layer 51. That is, the first semiconductor layer 51 is electrically connected to the first connection layer 501 by the first metal layer 55 through the first main side 60 without any vacant space there between. Therefore, the total connecting area between the first metal layer 55 and the first connection layer 501 is enlarged as shown in FIG. 5B compared with FIG. 2B, and the connection resistance can be reduced. As shown in FIG. 5B, the top view of the beveled trench 500 is circular or elliptic, and the beveled trench 500 is fully filled by the first metal layer 55 without any vacant space.

After forming the first metal layer 55 in the beveled trench, the semiconductor layer sequence 50a is connected to the carrier substrate 502 by the first connection layer 501. The material of the first connection layer 501 comprises metal like Au, Sn, Cr, Zn, Ni, Ti, Pt, or the combination thereof. The carrier substrate 502 is a conductive substrate comprising metal or metal alloy like Cu, Al, Sn, Zn, Cd, Ni, Co, W, Mo, or the combination thereof.

The light-emitting device 50 according to the embodiment of the present application further comprises a first electrode 503 formed on the carrier substrate 502 and electrically connected to the first semiconductor layer 51, and a second electrode 57 electrically connected to the second semiconductor layer 53.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting device, comprising:
   a semiconductor layer sequence comprising a first semiconductor layer having a first electrical conductivity, a second semiconductor layer having a second electrical conductivity, and an active layer interposed between the first semiconductor layer and the second semiconductor layer;
   a plurality of beveled trenches formed in the semiconductor layer sequence;
   a plurality of protruding structures respectively formed in the plurality of beveled trenches;
   a dielectric layer formed on the second semiconductor layer and an inner sidewall of the plurality of beveled trenches;
   a reflecting layer interposed between the semiconductor layer sequence and the dielectric layer; and
   a metal layer formed along the inner sidewall of the plurality of beveled trenches, wherein the dielectric layer, the reflecting layer and the metal layer are overlapping, the plurality of protruding structures and the reflecting layer are not overlapping.

2. The light-emitting device according to claim 1, wherein the plurality of protruding structures is surrounded by the reflecting layer.

3. The light-emitting device according to claim 1, wherein the metal layer and the plurality of protruding structures are overlapping.

4. The light-emitting device according to claim 1, wherein the plurality of protruding structures directly contacts with the first semiconductor layer.

5. The light-emitting device according to claim 1, wherein the dielectric layer comprises a surface perpendicular to a thickness direction of the semiconductor layer sequence, the metal layer extends onto the surface of the dielectric layer.

6. The light-emitting device according to claim 1, wherein the plurality of protruding structures comprises a layer sequence substantially same as the semiconductor layer sequence.

7. The light-emitting device according to claim 1, wherein the plurality of protruding structures and the plurality of beveled trenches comprise a similar shape from a top view of the light-emitting device.

8. The light-emitting device according to claim 1, wherein a circumference of one of the plurality of protruding structures is smaller than a circumference of one of the plurality of beveled trenches.

9. The light-emitting device according to claim 1, wherein the material of the plurality of protruding structures comprises metal.

10. The light-emitting device according to claim 1, wherein the inner sidewall of the plurality of beveled trenches comprises an inclined surface.

11. The light-emitting device according to claim 1, wherein the active layer comprises InGaN-based material, AlGaAs-based material, or AlInGaP-based material.

12. The light-emitting device according to claims 1, further comprising a carrier substrate and a connection layer formed between the carrier substrate and the semiconductor layer sequence, wherein the material of the connection layer comprises metal.

13. The light-emitting device according to claim 12, wherein the carrier substrate is conductive.

14. The light-emitting device according to claim 12, wherein the connection layer is formed between the metal layer and the carrier substrate.

15. The light-emitting device according to claim 1, further comprising a first electrode formed on the plurality of protruding structures.

16. The light-emitting device according to claim 15, further comprising a second electrode electrically connected to the second semiconductor layer, wherein the reflecting layer comprises a portion beyond the semiconductor layer sequence and the second electrode is on the portion of the reflecting layer.

17. The light-emitting device according to claim 15, wherein the reflecting layer comprises metal material.

18. A light-emitting device, comprising:
- a semiconductor layer sequence comprising a first semiconductor layer having a first electrical conductivity, a second semiconductor layer having a second electrical conductivity, and an active layer interposed between the first semiconductor layer and the second semiconductor layer;
- a beveled trench formed in the semiconductor layer sequence;
- a protruding structure formed in the beveled trench;
- a dielectric layer formed on the second semiconductor layer and an inner sidewall of the beveled trench;
- a reflecting layer interposed between the semiconductor layer sequence and the dielectric layer;
- a metal layer formed along the inner sidewall of the beveled trench;
- a carrier substrate; and
- a void between the metal layer and the carrier substrate.

19. The light-emitting device according to claim 18, wherein the dielectric layer, the reflecting layer and the metal layer are overlapping, the protruding structure and the reflecting layer are not overlapping.

20. The light-emitting device according to claim 18, further comprising a first connection layer between the carrier substrate and the metal layer, wherein the void is between the metal layer and the first connection layer.

* * * * *